(12) United States Patent
Sawataishi et al.

(10) Patent No.: US 9,001,481 B2
(45) Date of Patent: Apr. 7, 2015

(54) PROTECTION CIRCUIT

(71) Applicant: Alps Electric Co., Ltd., Tokyo (JP)

(72) Inventors: Tomoyuki Sawataishi, Miyagi-Ken (JP);
Akihisa Iikura, Miyagi-Ken (JP);
Kimihiro Nakao, Miyagi-Ken (JP);
Akira Asao, Miyagi-Ken (JP)

(73) Assignee: Alps Electric Co., Ltd., Tokyo (JP)

( * ) Notice: Subject to any disclaimer, the term of this patent is extended or adjusted under 35 U.S.C. 154(b) by 161 days.

(21) Appl. No.: 13/906,066

(22) Filed: May 30, 2013

(65) Prior Publication Data

US 2014/0002936 A1   Jan. 2, 2014

(30) Foreign Application Priority Data

Jun. 28, 2012 (JP) ................................ 2012-145279

(51) Int. Cl.
*H02H 3/38* (2006.01)
*H02H 3/00* (2006.01)
*H03K 19/003* (2006.01)

(52) U.S. Cl.
CPC ......... *H02H 3/003* (2013.01); *H03K 19/00315* (2013.01)

(58) Field of Classification Search
CPC .................................................... H02J 7/0031
USPC .......................................................... 361/77
See application file for complete search history.

(56) References Cited

U.S. PATENT DOCUMENTS 3,819,951 A * 6/1974 Moore ............................ 361/77
4,423,456 A * 12/1983 Zaidenweber .................. 361/77
7,852,639 B2 * 12/2010 Sells ............................... 363/17

FOREIGN PATENT DOCUMENTS

JP          5-152526      6/1993
JP          2002-335626   11/2002

* cited by examiner

*Primary Examiner* — Thienvu Tran
*Assistant Examiner* — Tien Mai
(74) *Attorney, Agent, or Firm* — Brinks Gilson & Lione (57) ABSTRACT

A protection circuit includes a power supply terminal, a ground terminal, a control unit connected to the power supply terminal and the ground terminal, and a supply unit connected to the power supply terminal and the ground terminal, for preventing application of voltage in a reverse direction to a circuit unit having a predetermined function. In this case, the control unit generates a control potential, which controls the control unit and the supply unit in accordance with a potential supplied from the power supply terminal and a potential supplied from the ground terminal. The supply unit is configured to be capable of supplying current to a circuit unit connected to a subsequent stage on the basis of a potential supplied from the power supply terminal, a potential supplied from the ground terminal, and the control potential generated by the control unit.

4 Claims, 5 Drawing Sheets

PROTECTION CIRCUIT

CLAIM OF PRIORITY

This application claims benefit of priority to Japanese Patent Application No. 2012-145279 filed on Jun. 28, 2012, which is hereby incorporated by reference in its entirety.

BACKGROUND

1. Field of the Disclosure

The present disclosure relates to protection circuits, which may prevent damage on a circuit, and it particularly relates to a protection circuit, which may prevent damage on a circuit due to a reverse connection of a power supply thereto.

2. Description of the Related Art

Figure 4:
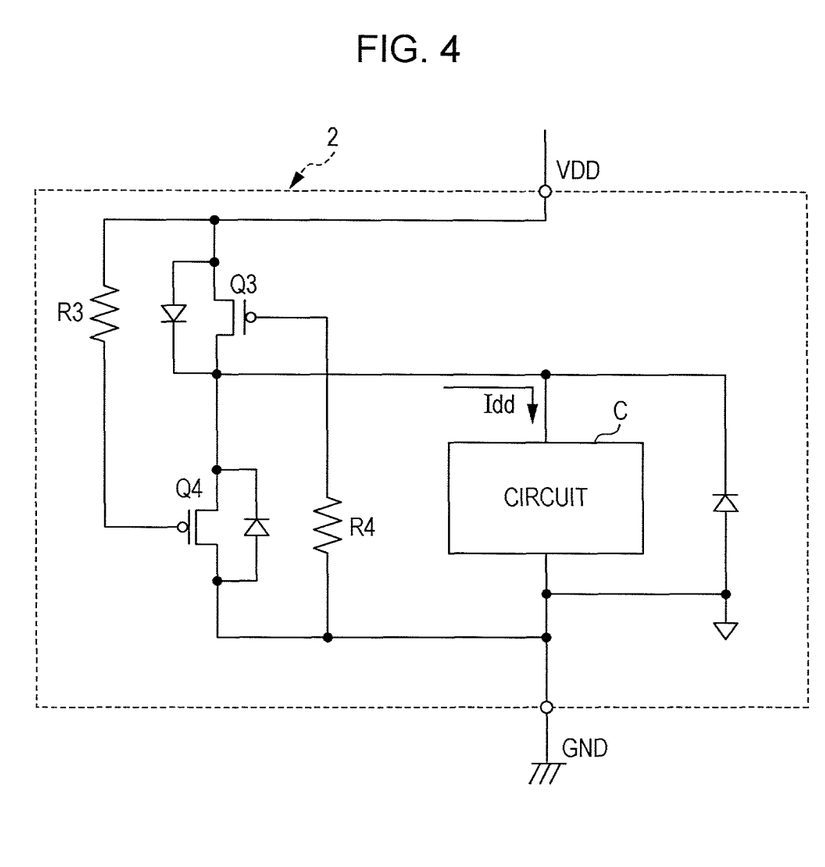
FIG. 4 is a circuit diagram illustrating an example of an integrated circuit including a protection circuit in the past.

A vehicle-mounted integrated circuit may include a protection circuit for preventing damage due to reverse connection of a power supply such as a battery (see Japanese Unexamined Patent Application Publication No. 5-152526). FIG. 4 illustrates a circuit configuration of an integrated circuit including such a protection circuit. A protection circuit 2 illustrated in FIG. 4 includes two P-channel type MOSFETs (Metal-Oxide-Semiconductor Field-Effect Transistors) Q3 and Q4 which are serially connected between a power supply terminal VDD and a ground terminal GND.

The MOSFET Q3 may have a source connected to the power supply terminal VDD and a gate connected to the ground terminal GND through a resistance R4. The MOSFET Q4 may have a drain connected to the ground terminal GND and a gate connected to the power supply terminal VDD through a resistance R3. The drain of the MOSFET Q3 is connected to the source of the MOSFET Q4, and a circuit C having a desirable function is connected between the connection point and the ground terminal GND.

When a power supply is forward connected to the integrated circuit (forward connection), a high level potential is supplied from the power supply terminal VDD to the source of the MOSFET Q3, and a low level potential is supplied from the ground terminal GND to the gate of the MOSFET Q3. This turns the MOSFET Q3 on. A low level potential is supplied from the ground terminal GND to the drain of the MOSFET Q4, and a high level potential is supplied from the power supply terminal VDD to the gate of the MOSFET Q4. This turns the MOSFET Q4 off. Thus, a current path is formed from the power supply terminal VDD to the ground terminal GND through the MOSFET Q3 and circuit C, and current Idd in a forward direction is fed to the circuit C.

On the other hand, when a power supply is reverse-connected to the integrated circuit (reverse connection), a low level potential is supplied from the power supply terminal VDD to the source of the MOSFET Q3, and a high level potential is supplied from the ground terminal GND to the gate of the MOSFET Q3. This turns the MOSFET Q3 off. A high level potential is supplied from the ground terminal GND to the drain of the MOSFET Q4, and a low level potential is supplied from the power supply terminal VDD to the gate of the MOSFET Q4. This turns the MOSFET Q4 off. In this case, the MOSFET Q3 is turned off, and the MOSFET Q4 is turned on. As a result, a current path through the circuit C is not formed. In this way, the protection circuit 2 may prevent damage on the circuit C by shutting down a current path through the circuit C upon reverse connection of the power supply.

In an integrated circuit including the protection circuit 2, when consumption current Idd increases because the size of the circuit C increases, for example, an increased amount of current is fed to the MOSFET Q3 to which to the power supply is forward connected. As a result, a voltage drop due to an ON resistance of the MOSFET Q3 increases, and the drain voltage of the MOSFET Q3 decreases. Occurrence of such a voltage drop prevents application of a proper reverse bias to a PN junction present in the protection circuit 2, which facilitates flow of unnecessary current and may damage the integrated circuit including the protection circuit 2.

Japanese Unexamined Patent Application Publication No. 2002-335626 is an example of related art.

SUMMARY

A protection circuit, for preventing damage on a circuit unit having a predetermined function includes a power supply terminal, a ground terminal, and first to third transistors. The first transistor has one of a source and a drain connected to the power supply terminal and a gate connected to the ground terminal and has the other one of the source and drain connected to a first region including a region where a channel is to be formed in the first transistor. The second transistor has one of a source and a drain connected to a second region including a region where a channel is to be formed in the second transistor and the other one of the source and drain of the first transistor, a gate connected to the power supply terminal, the other one of the source and drain connected to the ground terminal. The third transistor has one of a source and a drain connected to the power supply terminal, a gate connected to the ground terminal, the other one of the source and drain connected to the ground terminal through the circuit unit. The first region and the second region are integrally formed and are connected to a third region including a region where a channel is formed in the third transistor.

DESCRIPTION OF THE EXEMPLARY EMBODIMENTS

Figure 5:
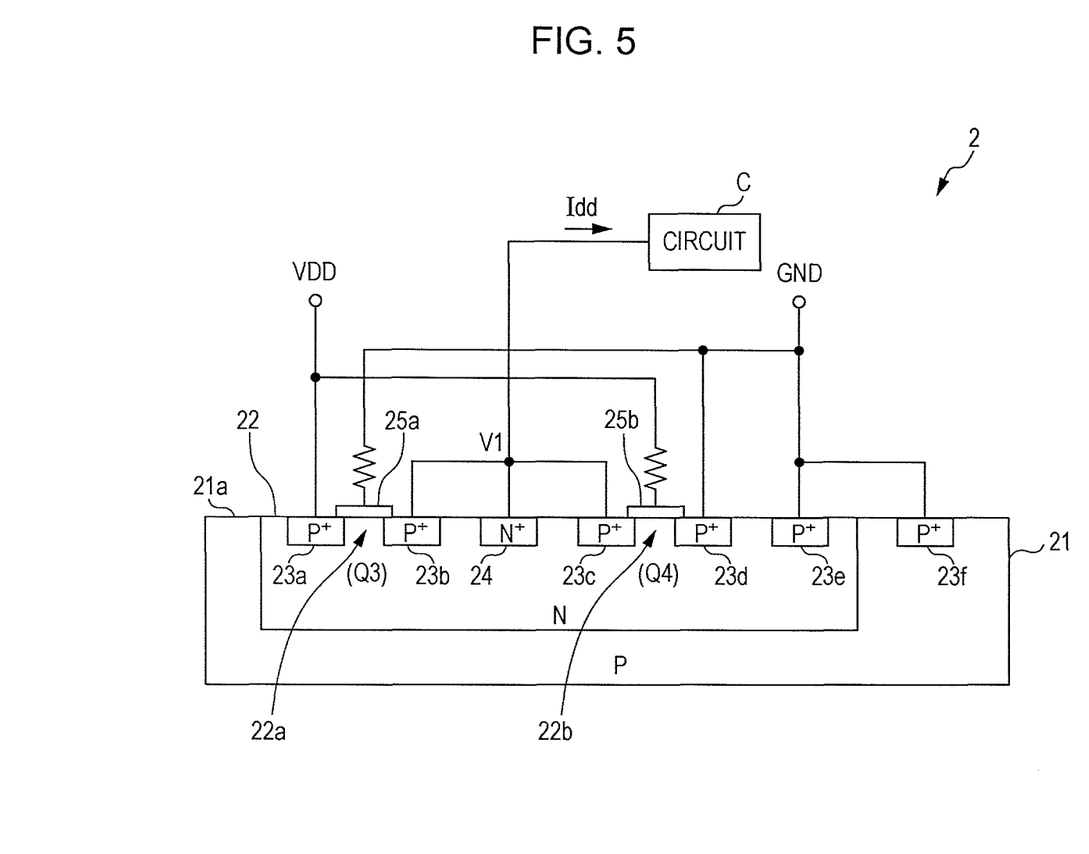
FIG. 5 is a schematic diagram illustrating an example of an element structure of the protection circuit illustrated in FIG. 4.

With reference to FIG. 5, an example of an element structure of a protection circuit 2 in FIG. 4 will be described. FIG. 5 is a schematic diagram illustrating an example of an element structure assumed in the protection circuit 2 in FIG. 4. The protection circuit 2 illustrated in FIG. 5 has a P-type substrate 21 of silicon containing impurities (acceptors) such as boron and aluminum. An N-well 22 containing impurities (donors) such as phosphorus and arsenic is provided on a surface 21a side of the P-type substrate 21. The N-well 22 has high concentration P-type regions 23a to 23e containing a high concentration of acceptors and a high concentration N-type region 24 containing a high concentration of donors, which are spaced apart, and a high concentration P-type region 23f externally to the N-well 22.

As illustrated in FIG. 5, the MOSFET Q3 includes a high concentration P-type region 23a that functions as a source and a high concentration P-type region 23b that functions as a drain. A channel-formed region (a region where a channel is to be formed) 22a including a part of the N-well 22 is arranged between the high concentration P-type region 23a and the high concentration P-type region 23b. A gate insulating film 25a including a silicon oxide film is formed on a surface of the channel-formed region 22a. A gate electrode (not illustrated) containing polysilicon, which controls the ON/OFF state of the MOSFET Q3, is provided on the gate insulating film 25a.

The MOSFET Q4 has a similar configuration to that of the MOSFET Q3. In other words, MOSFET Q4 includes a high concentration P-type region 23c to be a source, a high concentration P-type region 23d to be a drain, a channel-formed region 22b, a gate insulating film 25b, and a gate electrode (not illustrated).

A source electrode, not illustrated, is connected to the high concentration P-type regions 23a and 23c, and a drain electrode, not illustrated, is connected to the high concentration P-type regions 23b and 23d. Electrodes, not illustrated, are also connected to the high concentration P-type regions 23e and 23f and high concentration N-type region 24. Connecting these elements through the electrodes to satisfy a predetermined relationship may provide the protection circuit 2 having the circuit configuration illustrated in FIG. 4.

The protection circuit 2 illustrated in FIGS. 4 and 5 in which a power supply is forward connected (forward connection) will be described below. In this case, because the MOSFET Q3 is turned on, current Idd is fed to the MOSFET Q3 and circuit C. A voltage drop of the MOSFET Q3 is equal to Ron×Idd where Ron is an ON resistance of the MOSFET Q3. Thus, when the consumption current Idd increases in accordance with the size of the circuit C, the voltage drop occurring in the MOSFET Q3 increases.

The high concentration P-type region 23b to be a drain of the MOSFET Q3 is connected to the high concentration P-type region 23c and high concentration N-type region 24 and is also connected to the N-well 22. Thus, when an increased voltage drop in the MOSFET Q3 largely lowers the potential of the high concentration P-type region 23b, the potential of the N-well 22 is also significantly lowered. A predetermined ground potential is supplied to the P-type substrate 21 through the high concentration P-type region 23f. A largely lowered potential of the N-well 22 significantly reduces a reverse bias to a PN junction between the N-well 22 and the P-type substrate 21. As a result, current is fed from the N-well 22 to the P-type substrate 21, and large current may possibly occur between the power supply potential and the ground potential.

The present inventor et al. have considered that the phenomenon might be due to a decrease of the potential of the N-well 22 and the problem might be overcome by causing the potential of the N-well 22 to be free from an influence of consumption current of a subsequent circuit C. Then, the inventor et al. have completed the present invention by embodying a protection circuit which may supply current to the circuit C without through a transistor corresponding to the MOSFET Q3 in FIGS. 4 and 5. In other words, essentially, the present invention includes a control unit including first and second transistors serially connected between a power supply terminal and a ground terminal and a supply unit including a third transistor which supplies current. A protection circuit according to this embodiment will be described below.

First Embodiment

Figure 1:
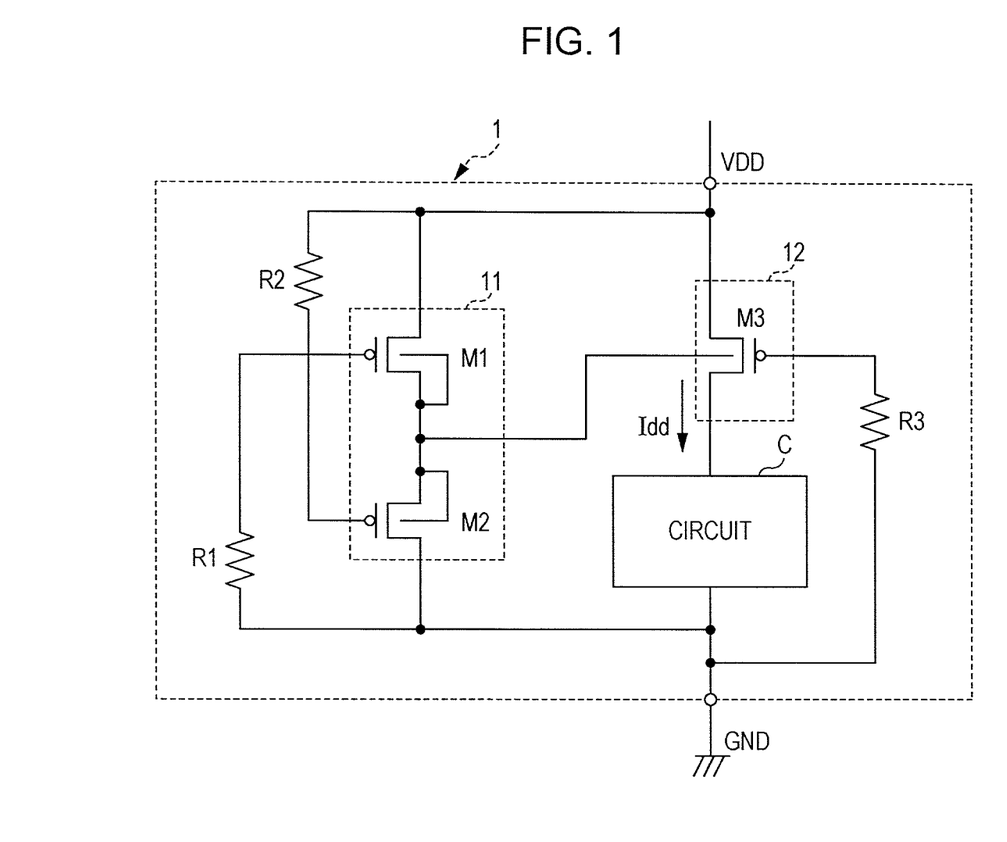
FIG. 1 is a circuit diagram illustrating a configuration of an apparatus including a protection circuit according to a first embodiment.
Figure 2:
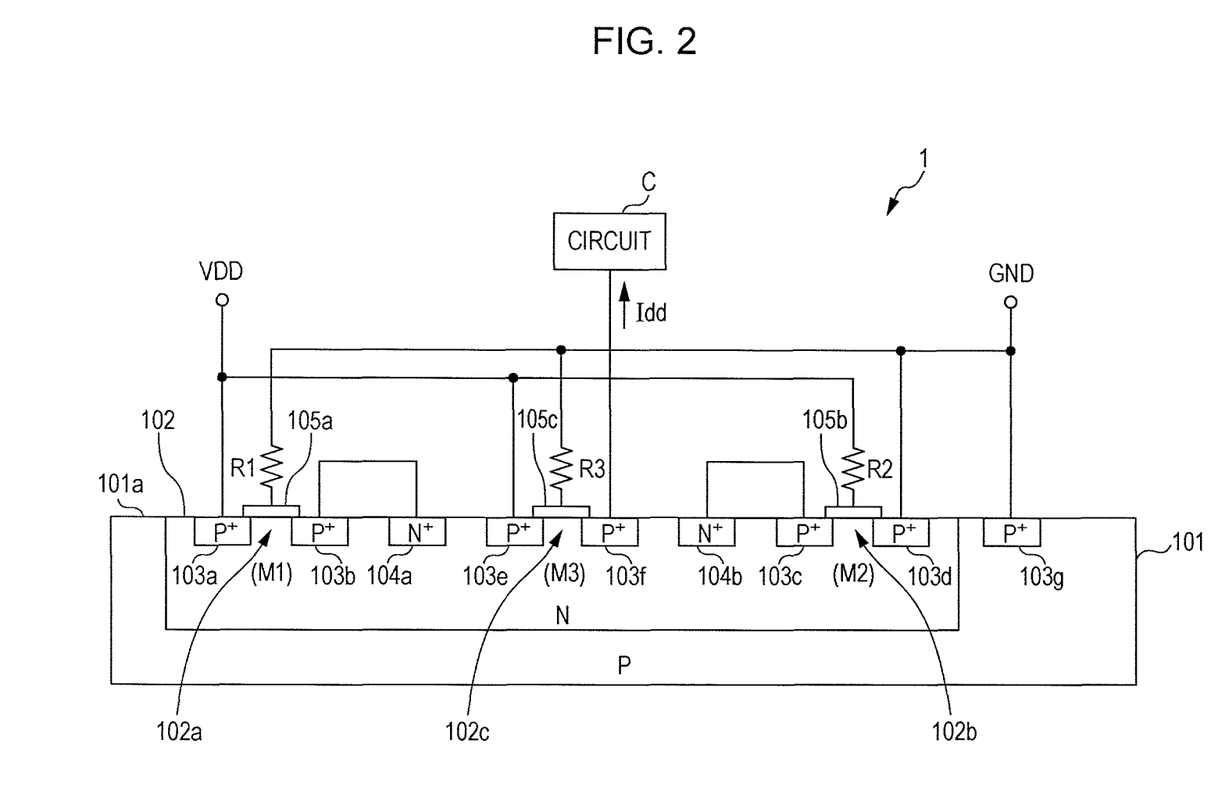
FIG. 2 is a schematic diagram illustrating an example of an element structure of the protection circuit according to the first embodiment.

FIG. 1 is a circuit diagram illustrating a configuration of an apparatus including a protection circuit 1 according to a first embodiment. FIG. 2 is a schematic diagram illustrating an example of an element structure of the protection circuit 1 according to this embodiment. As illustrated in FIG. 1, the protection circuit 1 of this embodiment includes a power supply terminal VDD, a ground terminal GND, three transistors M1 to M3, and three resistances R1 to R3. A high level potential is supplied to the power supply terminal VDD forward connected to a power supply (DC power supply), not illustrated, and a low level potential is supplied to the ground terminal GND forward connected to the power supply.

The three transistors M1 to M3 are all P-channel type MOSFETs. A control unit 11, which controls a potential of an N-well 102 (see FIG. 2), which will be described below, includes the transistor (first transistor) M1 and transistor (second transistor) M2. A supply unit 12, which supplies current to a circuit C, includes the transistor (third transistor) M3. The supply unit 12 controls current supply to the circuit C on the basis of a potential supplied from the power supply terminal VDD, a potential supplied from the ground terminal GND, and a potential (control potential) supplied from the control unit 11 to the N-well 102.

The transistor M1 included in the control unit 11 may have a source connected to the power supply terminal VDD and a gate connected to the ground terminal GND through a resistance (first resistance) R1. The transistor M1 may have a drain connected to a first region 102a (see FIG. 2) including a region (channel-formed region) where a channel is to be formed in the transistor M1. The transistor M2 may have a drain connected to the ground terminal GND and a gate connected to the power supply terminal VDD through a resistance (second resistance) R2. The transistor M2 may have a source connected to a second region 102b (see FIG. 2) including a channel-formed region in the transistor M2.

The drain of the transistor M1 and the source of the transistor M2 are connected to each other. The connection point is an output end of the control unit 11 and is connected to a third region 102c (see FIG. 2) including a channel-formed region of the transistor M3 included in the supply unit 12. The transistor M3 may have a source connected to the power supply terminal VDD and a gate connected to the ground terminal GND through a resistance (third resistance) R3. The transistor M3 may have a drain connected to the ground terminal GND through a circuit (circuit unit) C having a predetermined function.

As illustrated in FIG. 2, the protection circuit 1 is provided on a P-type substrate 101 of silicon containing acceptors. The N-well 102 containing donors is formed on a surface 101a side of the substrate 101 by an ion implantation method, for example. In the N-well 102, high concentration P-type regions 103a to 103f containing a high concentration of acceptors and high concentration N-type regions 104a and 104b containing a high concentration of donors are spaced apart. A high concentration P-type region 103g is provided externally to the N-well 102. The substrate 101 may not be a silicon substrate.

The high concentration P-type regions 103a and 103b are regions to be a source and a drain, respectively, of the transistor M1, and a gate insulating film 105a that is a silicon oxide film is formed so as to cover a surface of the N-well 102 between the high concentration P-type regions 103a and 103b. A gate electrode, not illustrated, of polysilicon, which controls the ON/OFF state of the transistor M1, is provided on the gate insulating film 105a. A source electrode and drain electrode, not illustrated, which are connected to the high concentration P-type regions 103a and 103b, respectively, are provided on the high concentration P-type regions 103a and 103b. Note that materials of the gate insulating film, gate electrode, source electrode and drain electrode are not limited.

A predetermined potential may be supplied to the gate electrode of the transistor M1, and the electric field may be applied to the N-well 102 so that the formation of a channel in the N-well 102 may be controlled to control the ON/OFF state of the transistor M1. For example, a lower potential of the gate electrode than potentials of the source (or drain) may allow formation of a channel in a region in vicinity of the gate insulating film 105a in the N-well 102, which turns on the transistor M1. Conversely, a higher potential of the gate electrode than the potential of the source (or drain) shuts down the channel, which turns off the transistor M1. According to this embodiment, a region (including a channel-formed region) in vicinity of the transistor M1 in the N-well 102 will be called a first region 102a.

The high concentration P-type region 103a to be a source of the transistor M1 is connected to the power supply terminal VDD. The high concentration P-type region 103b to be a drain is connected to the N-well 102 through the high concentration N-type region 104a. Thus, the potential of the N-well 102 (first region 102a) is substantially equal to the potential of the drain. The transistor M1 may have a gate electrode (not illustrated) connected to the ground terminal GND through the resistance R1 so that an electric field according to the potential of the ground terminal GND is applied to the first region 102a.

The high concentration P-type regions 103c and 103d have regions to be a source and a drain, respectively, of the transistor M2, and a gate insulating film 105b is formed so as to cover a surface of the N-well 102 between the high concentration P-type regions 103c and 103d. A gate electrode, not illustrated, which controls the ON/OFF state of the transistor M2 is provided on the gate insulating film 105b. A source electrode and a drain electrode, not illustrated, connected to the high concentration P-type regions 103c and 103d, respectively, are provided on the high concentration P-type regions 103c and 103d. According to this embodiment, a region (including a channel-formed region) in vicinity of the transistor M2 in the N-well 102 will be called a second region 102b.

The high concentration P-type region 103d to be a drain of the transistor M2 is connected to a ground terminal. The high concentration P-type region 103c to be a source thereof is connected to the N-well 102 through the high concentration N-type region 104b. Thus, the potential of the N-well 102 (second region 102b) is substantially equal to the potential of the source. The gate electrode is connected to the power supply terminal VDD through a resistance R2, and an electric field according to the potential of the power supply terminal VDD is applied to the second region 102b through the gate insulating film 105b.

The high concentration P-type regions 103e and 103f are regions to be a source and a drain, respectively, of the transistor M3, and a gate insulating film 105c is formed so as to cover a surface of the N-well 102 between the high concentration P-type regions 103e and 103f. A gate electrode, not illustrated, which controls the ON and OFF state of the transistor M3 is formed on the gate insulating film 105c. Source electrode and drain electrode, not illustrated, connected to the high concentration P-type regions 103e and 103f, respectively, are provided on the high concentration P-type regions 103e and 103f. According to this embodiment, a region (including a channel-formed region) in vicinity of the transistor M3 in the N-well 102 will be called a third region 102c.

The high concentration P-type region 103e to be a source of the transistor M3 is connected to the power supply terminal VDD, and the high concentration P-type region 103f to be a drain of the transistor M3 are connected to a circuit C having a predetermined function. The gate electrode is connected to the ground terminal GND through a resistance R3, and an electric field according to the potential of the ground terminal GND is applied to the third region 102c through the gate insulating film 105c.

The third region 102c of the transistor M3 is provided within the same N-well 102 along with the first region 102a of the transistor M1 and the second region 102b of the transistor M2. Thus, the potentials of the first region 102a, second region 102b, and third region 102c are substantially equal. In other words, the potentials of the drain of the transistor M1 and the source of the transistor M2 are also supplied to the third region 102c of the transistor M3.

The P-type substrate 101 is connected to the ground terminal GND through the high concentration P-type region 103g so that the potential of the P-type substrate 101 may be kept substantially equal to the potential of the ground terminal GND. Note that electrodes, not illustrated, in contact with the high concentration P-type region 103g and high concentration N-type regions 104a and 104b are provided on the high concentration P-type region 103g and high concentration N-type regions 104a and 104b.

Reverse connection of a power supply to an integrated circuit including the protection circuit 1 allows supply of a low level potential from the power supply terminal VDD to the source of the transistor M1 and supply of a high level potential from the ground terminal GND to the gate, which turns off the transistor M1. A high level potential is supplied from the ground terminal GND to the drain of the transistor M2, and a low level potential is supplied from the power supply terminal VDD to the gate, which turns on the transistor M2. Since the source of the transistor M2 is connected to the N-well 102, the potential of the N-well 102 is raised to a high level.

A low potential is supplied from the power supply terminal VDD to the source of the transistor M3, and a high level potential is supplied from the ground terminal GND to the gate, which turns off the transistor M3. As a result, a current path through the circuit C is not formed, and current is not fed to the circuit C. This may prevent damage on the circuit C upon reverse connection of the power supply.

On the other hand, forward connection of a power supply to an integrated circuit including the protection circuit 1 allows supply of a high level potential from the power supply terminal VDD to the source of the transistor M1 and supply of a low level potential from the ground terminal GND to the gate, which turns on the transistor M1. A low level potential is supplied from the drain of the transistor M2 to the ground terminal GND, and a high level potential is supplied from the power supply terminal VDD to the gate, which turns on transistor M2. As a result, a high level potential is supplied from the power supply terminal VDD to a connection point of the drain of the transistor M1 and the source of the transistor M2. The drain (high concentration P-type region 103b) of the transistor M1 is connected to the N-well 102 through the high concentration N-type region 104a. The source (high concentration P-type region 103c) of the transistor M2 is connected to the N-well 102 through the high concentration N-type region 104b. Thus, the potential of the N-well 102 is raised to a high level.

A high level potential is supplied from the power supply terminal VDD to the source of the transistor M3, and a low level potential is supplied from the ground terminal GND to the gate, which turns on the transistor M3. As a result, a predetermined voltage is applied to the circuit C, and current Idd is fed to the circuit C through the transistor M3. At that time, the potential of the N-well 102 is at a high level that is close to the potential of the power supply terminal VDD, and the potential of the P-type substrate 101 is at a low level that is close to the potential of the ground terminal GND. Thus, a reverse bias is applied to a PN junction between the P-type substrate 101 and the N-well 102, and current is not fed from the N-well 102 to the P-type substrate 101.

In the protection circuit 1, the potential of the N-well 102 does not vary significantly even when the consumption current Idd of the circuit C increases. This is because the potential of the N-well 102 is controlled by the control unit 11 (transistors M1 and M2) to keep a high level regardless of the consumption current Idd of the circuit C. In other words, a reduction of the potential of the N-well 102 may be prevented even with an increased consumption current Idd of the circuit C, resulting in application of a proper reverse bias to the P-type substrate 101 and the N-well 102. This may inhibit a leak current from the N-well 102 to the P-type substrate 101 and may prevent occurrence of a large current between the power supply terminal VDD and the ground terminal GND.

Since current is supplied to the circuit C through the transistor M3, the transistor M3 desirably has a sufficiently small ON resistance. The ON resistance may be reduced by increasing a width of the channel, for example. On the other hand, since the protection circuit 1 does not employ the transistor M1 as a path for the current Idd, the sizes of the transistors M1 and M2 may be sufficiently reduced.

In the protection circuit 1 of this embodiment, since current is supplied to a circuit (circuit unit) C through the transistor (third transistor) M3, the connection point between a drain (or source) of the transistor (first transistor) M1 and a source (or drain) of the transistor (second transistor) M2 is free from an influence of consumption current Idd of the circuit C. This may prevent a reduction of a potential of the N-well 102 (first region 102a, second region 102b, and third region 102c) due to a voltage drop of the transistor M1, which may apply a proper reverse bias to between the N-well 102 and the substrate 101. Thus, current fed from the N-well 102 to the substrate 101 may be prevented, which may properly protect the circuit C even it has a large consumption current Idd.

Second Embodiment

Figure 3:
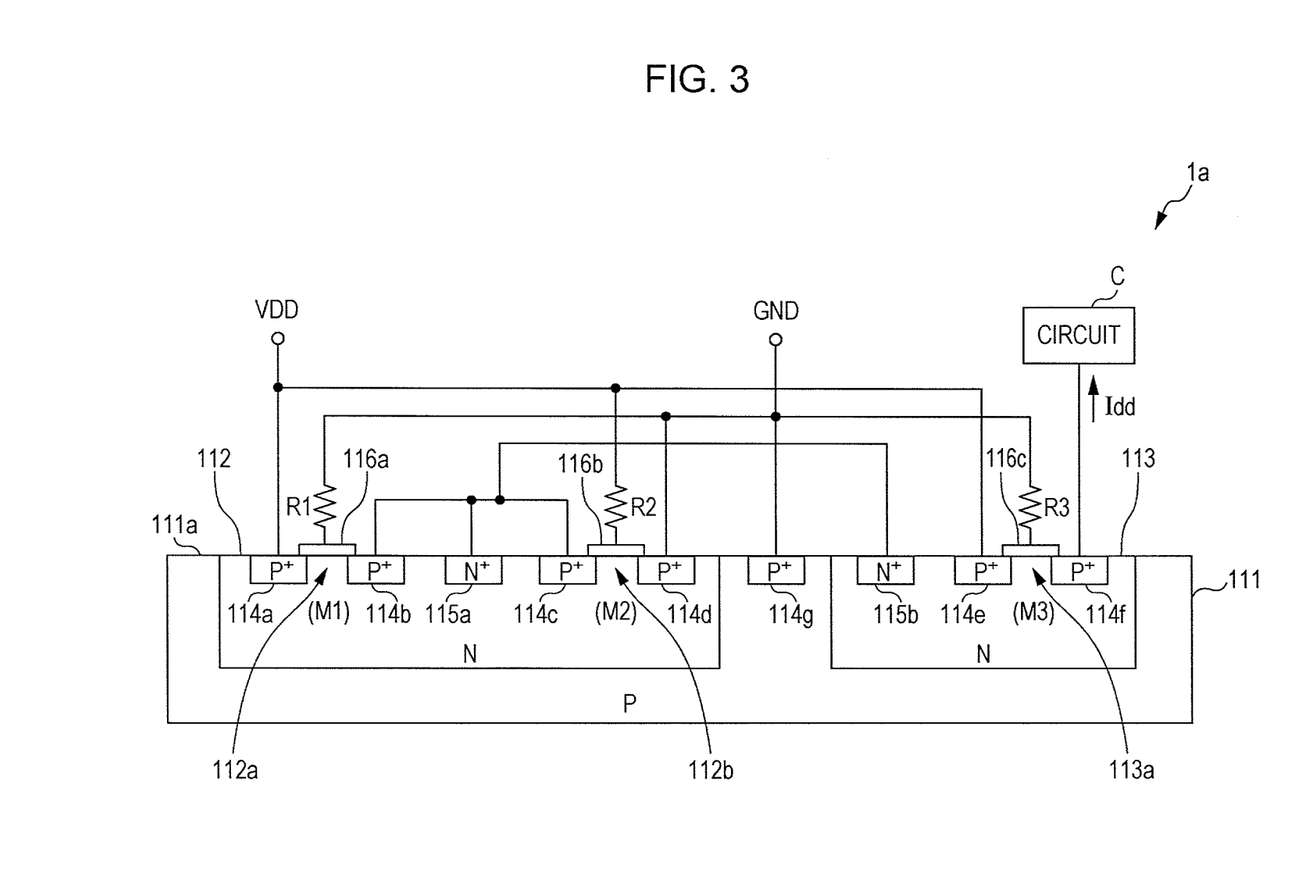
FIG. 3 is a schematic diagram illustrating an example of an element structure of a protection circuit according to a second embodiment.

According to a second embodiment, a protection circuit will be described which is different from the first embodiment. FIG. 3 is a schematic diagram illustrating an example of an element structure of a protection circuit 1a according to this embodiment. The protection circuit 1a according to this embodiment is the same as the protection circuit 1 according to the first embodiment except for its element structure. Since the circuit configuration of the protection circuit 1a is the same as the protection circuit 1 illustrated in FIG. 1, the detail description on the circuit configuration will be omitted.

As illustrated in FIG. 3, the protection circuit 1a of this embodiment is provided on a P-type substrate 111. N-wells 112 and 113 containing donors is formed on a surface 111a side of the substrate 111 by an ion implantation method, for example. In the N-well 112, high concentration P-type regions 114a to 114d containing a high concentration of acceptors and a high concentration N-type region 115a containing a high concentration of donors are spaced apart. In the N-well 113, high concentration P-type regions 114e and 114f and high concentration N-type region 115b are spaced apart from each other. A high concentration P-type region 114g is provided externally to the N-wells 112 and 113.

In the protection circuit 1a of this embodiment, a transistor M1 includes high concentration P-type regions 114a and 114b to be a source or a drain, a gate insulating film 116a, a first region 112a where a channel is to be formed, a source electrode, a drain electrode, and a gate electrode, not illustrated. A transistor M2 includes high concentration P-type regions 114c and 114d to be a source or a drain, a gate insulating film 116b, a second region 112b in which a channel is to be formed, a source electrode, a drain electrode, and a gate electrode, not illustrated. A transistor M3 includes high concentration P-type regions 114e and 114f to be a source or a drain, a gate insulating film 116c, a third region 113a in which a channel is to be formed, a source electrode, a drain electrode, and a gate electrode, not illustrated.

In the protection circuit 1a of this embodiment, the N-well 112 having the transistors M1 and M2 and the N-well 113 having the transistor M3 are separated. However, the N-well 112 and the N-well 113 are electrically coupled through the high concentration N-type region 115a and high concentration N-type region 115b and have potentials that are substantially equal.

Also in the protection circuit 1a having the configuration described above, current is supplied to a circuit (circuit unit) C through the transistor (third transistor) M3. Thus, the connection point between a drain (or a source) of the transistor (first transistor) M1 and a source (or drain) of the transistor (second transistor) M2 is free from an influence of consumption current Idd of the circuit C. Thus, a decrease of the potentials of the N-well 112 (first region 112a, second region 112b) and N-well 113 (third region 103a) due to a voltage drop of the transistor M1 may be prevented, and a proper reverse bias is applicable to between the N-wells 112 and 113 and the substrate 111. Therefore, occurrence of current fed from the N-wells 112 and 113 to the substrate 111 may be prevented, and a protection circuit being capable of appropriately protecting a circuit unit having large consumption current C.

The present invention is not limited to the aforementioned embodiments and may be varied properly so as to exert its effects. For example, the transistors M1 to M3 are not limited to MOSFETs but may be other types of FET. The resistance R1 to R3 may be other types of impedance element and may be omitted as far as a proper potential may be supplied to gates of the transistors M1 to M3. An impedance element corresponding to the resistance R3 may include the circuit C.

Having described the protection circuits 1 and 1a are integrated to the circuit C in the aforementioned embodiments, the protection circuits 1 and 1a may be separately provided from the circuit C. According to the aforementioned embodiments, the relationship between the sources and drains of the transistors M1 to M3 is fixed for convenience of description. However, the sources and the drains may be interchanged in accordance with a potential to be supplied. In other words, a source may be replaced by a drain, and a drain may be replaced by a source according to an embodiment of the present invention.

According to the aforementioned embodiments, a gate of the transistor M1, a drain of the transistor M2 and a gate of the transistor M3 are connected to a ground terminal. However, a gate of the transistor M1, a drain of the transistor M2 and a gate of the transistor M3 may be configured to supply a ground potential through the circuit C.

A protection circuit of the present invention may be useful for protection of a circuit, such as a vehicle-mounted integrated circuit, which may possibly damaged by a reverse connection of a power supply.

What is claimed is:

1. A protection circuit for preventing application of voltage in a reverse direction to a circuit unit having a predetermined function, comprising:
a power supply terminal;
a ground terminal; and
first to third transistors,
wherein:
the first transistor has one of a source and a drain connected to the power supply terminal and a gate connected to the ground terminal and has the other one of the source and drain connected to a first region including a region where a channel is to be formed in the first transistor;
the second transistor has one of a source and a drain connected to a second region including a region where a channel is to be formed in the second transistor and the other one of the source and drain of the first transistor, a gate connected to the power supply terminal, the other one of the source and drain connected to the ground terminal;
the third transistor has one of a source and a drain connected to the power supply terminal, a gate connected to the ground terminal, the other one of the source and drain connected to the ground terminal through the circuit unit; and
the first region and the second region are integrally formed and are connected to a third region including a region where a channel is formed in the third transistor.

2. The protection circuit according to claim 1, wherein the first to third regions are integrally formed.

3. The protection circuit according to claim 1, further comprising:
first to third resistance units, wherein:
the first transistor has a gate connected to the ground terminal through the first resistance unit, the second transistor has a gate connected to the power supply terminal through the second resistance unit, and the third transistor has a gate connected to the ground terminal through the third resistance unit.

4. A protection circuit for preventing application of voltage in a reverse direction to a circuit unit having a predetermined function, comprising:
a power supply terminal;
a ground terminal;
a control unit connected to the power supply terminal and the ground terminal; and
a supply unit connected to the power supply terminal and the ground terminal,
wherein:
the control unit generates a control potential which controls the supply unit in accordance with a potential supplied from the power supply terminal and a potential supplied from the ground terminal;
the supply unit has a field-effect transistor;
the control potential is applied to a region where a channel is to be formed in a field-effect transistor included in the supply unit; and
the supply unit is configured to supply current to a circuit unit connected to a subsequent stage on the basis of a potential supplied from the power supply terminal, a potential supplied from the ground terminal, and the control potential generated by the control unit.

* * * * *